(12) United States Patent  
Jungerman

(10) Patent No.: US 6,715,112 B2
(45) Date of Patent: Mar. 30, 2004

(54) METHOD AND APPARATUS FOR DISPLAYING TRIGGERED WAVEFORM ON AN ERROR PERFORMANCE ANALYZER

(75) Inventor: Roger Lee Jungerman, Petaluma, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 521 days.

(21) Appl. No.: 09/727,211

(22) Filed: Nov. 29, 2000

(65) Prior Publication Data

US 2002/0063553 A1 May 30, 2002

(51) Int. Cl.[7] .............................................. G06F 11/00
(52) U.S. Cl. ......................................... 714/704; 714/37
(58) Field of Search .......................... 324/76.24, 121 R, 324/76.19; 318/609, 638, 610; 702/112, 57, 66, 67, 76, 70, 71; 714/703, 704, 745, 738, 37, 724

(56) References Cited

U.S. PATENT DOCUMENTS 3,614,609 A * 10/1971 Grubel et al. ............ 324/76.15
3,636,445 A * 1/1972 Douaihy et al. .......... 324/76.15
3,944,929 A * 3/1976 Matsuo ..................... 324/76.24
4,507,740 A * 3/1985 Star et al. ...................... 702/57
5,900,755 A * 5/1999 Toeppen et al. ............. 327/163
6,233,288 B1 * 5/2001 Takaoku et al. ............. 375/316

* cited by examiner

Primary Examiner—Albert Decady
Assistant Examiner—Mujtaba Chaudry

(57) ABSTRACT

A method and apparatus for displaying a waveform on an error performance analyzer are disclosed. A repeated base bit pattern is received. Then, at a first time and for each incremental time thereafter for a predetermined period of time, multivalued voltage, $V_M$, is determined. The $V_M$ is determined by constructing a bit error rate (BER) curve at the each incremental time. Each BER-curve spans a range of voltages from a low slice voltage to a high slice voltage. A derivative of the BER-curve is taken and absolute value of the derivative is used to determine the $V_M$ which is the slice voltage where the absolute value of the derivative curve is greatest. The apparatus includes a processor and storage with instructions for the processor to perform these operations.

13 Claims, 5 Drawing Sheets

METHOD AND APPARATUS FOR DISPLAYING TRIGGERED WAVEFORM ON AN ERROR PERFORMANCE ANALYZER

BACKGROUND

The present invention relates to error performance analyzers. This application for patent is a continuation-in-part of Ser. No. 09/723,821 an application filed on Nov. 28, 2000, titled "Method And Apparatus For Displaying Triggered Waveform On An Error Performance Analyzer", Attorney Docket No. 10003986-1. More specifically, the present invention relates to the method and apparatus for displaying waveforms of binary digit transmission using error performance analyzers.

A fundamental measure of quality of digital circuits, switches, and transmission systems is the probability of any stored or transmitted bit being transmitted in error, or bit error ratio (BER). The BER is typically tested using a bit error ratio tester (BERT) which may include of a pattern generator and an error detector. The pattern generator and the error detector are often combined in a single unit though this is not required. They are, in fact, sometimes separate units. The pattern generator generates a known sequence of bits (sequence of zeros and ones) for transmission through a device under test (DUT). Typically, the known sequence of bits is often generated by a pseudo-random bit sequencer (PRBS) and is of known length of $2^N-1$ bits where N may be any number. Commonly, numbers seven (7) or a ten (10) are used as the value of N. The known sequence of bits may be referred to as a base bit sequence, or a base bit pattern. The base bit pattern is continually repeated by the pattern generator.

The repeated base bit pattern is transmitted to the DUT which, in turn, transmits the bit sequences to be received by the error detector. The error detector compares the received bit sequence with the known bit sequence for error bit detection. Usually, the error detector also generates the known sequence of bits, or repeated base bit pattern, such that the error detector can compare the received bit sequence with the known bit sequence to detect errors in transmission. An error bit is a bit that is sent to the DUT as a zero but transmitted by the DUT as a one, or a bit that is sent to the DUT as a one but transmitted by the DUT as a zero. Then, the number of error bits is compared with the number of bits received. The ratio of the error bits to the sent bits is the bit error ratio, BER. With modern devices, the BER tends to be very low and can be on the order of $10^{-12}$ or even less.

As discussed, an error detector provides the BER as one measure of quality of the DUT. However, to determine digital waveform signal quality of any particular section of the base bit sequence, an oscilloscope is utilized to view the section in an eyeline mode. In eyeline mode, a pattern trigger that is synchronized with the repeating base bit sequence of the pattern generator is used to display a waveform of the selected section. The uses of the eyeline mode display the waveform diagram and the methods of generating the waveform diagram using an oscilloscope are known in the art.

In summary, to test a DUT for its error rate as well as to examine the quality of the waveform signal quality of the DUT, two devices are needed—an error detector and an oscilloscope. However, the use of the oscilloscope adds to the hardware requirements and costs to the DUT testing process. It would be preferable to display the waveform diagram using the error detector alone. Accordingly, there is a need for a technique and an apparatus to obtain the BER as well as to display the waveform diagram without the use of an oscilloscope.

SUMMARY

These needs are met by the present invention. According to one embodiment of the present invention, a technique of displaying a waveform on an error performance analyzer is disclosed. A first bit sequence comprising repeated base bit pattern, each bit either a 0-bit signified by a first bit voltage, $V_{LB}$, and 1-bit signified by a second bit voltage, $V_{HB}$ is received. Then, at a first time within the base bit pattern and each incremental time thereafter for a predetermined period of time, multivalue voltage, $V_M$, is determined. Finally, the multivalue voltage at the first time and the multivalue voltage at each incremental time thereafter is displayed.

According to another embodiment of the invention, A first bit sequence comprising repeated base bit pattern, each bit either a 0-bit signified by a first bit voltage, $V_{LB}$, and 1-bit signified by the a second bit voltage, $V_{HB}$, is received. Then, at a first time within the base bit pattern and each incremental time thereafter for a predetermined period of time, multivalue voltage spread is determined. Finally, the multivalue voltage spread at the first time and the multivalue voltage spread at each incremental time thereafter is displayed.

According to yet another embodiment of the invention, an apparatus for displaying a waveform is disclosed. The apparatus has a processor and storage connected to the processor including instructions for the processor to receive a first bit sequence comprising repeated base bit pattern, each bit either a 0-bit signified by a first bit voltage, $V_{LB}$, and 1-bit signified by a second bit voltage, $V_{HB}$. Further, instructions include instructions for the processor to determine, at a first time within the base bit pattern and each incremental time thereafter for a predetermined period of time, multivalue voltage spread, $V_M$-spread.

Other aspects and advantages of the present invention will become apparent from the following detailed description, taken in conjunction with the accompanying drawings, illustrating by way of example, the principles of the present invention.

DETAILED DESCRIPTION

Figure 1:
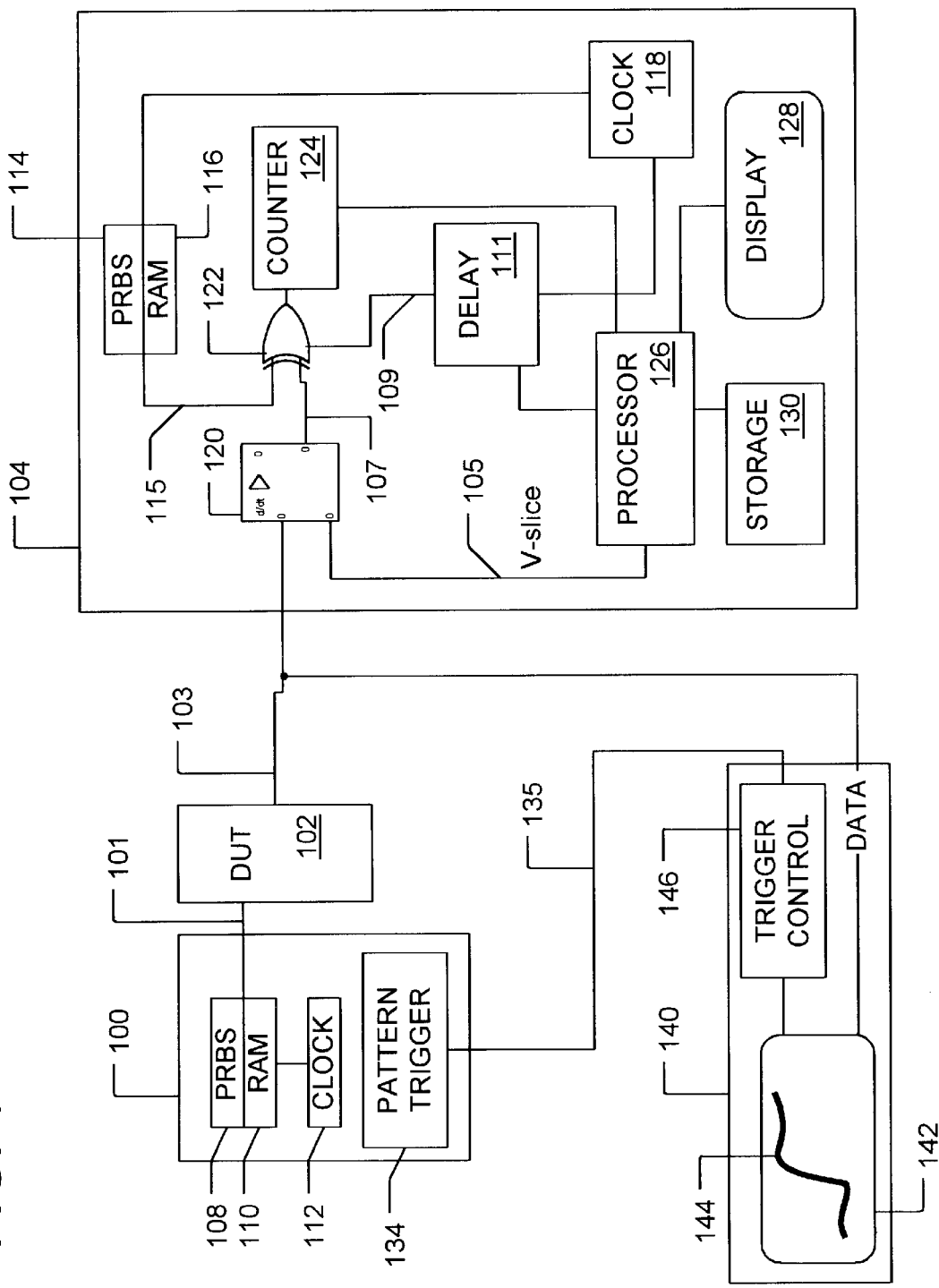
FIG. 1 illustrates a bit error rate testing configuration in simplified blocks.

As shown in the drawings for purposes of illustration, the present invention is embodied in a technique and an apparatus for displaying waveforms using an error performance analyzer. A first bit sequence comprising repeated base bit pattern, each bit either a 0-bit signified by a first bit voltage, $V_{LB}$, or a 1-bit signified by a second bit voltage, $V_{HB}$, is received. Then, at a first time within the base bit pattern and each incremental time thereafter for a predetermined period of time, multivalue voltage, $V_M$, is determined. Finally, the multivalue voltage at the first time and the multivalue voltage at each incremental time thereafter is displayed.

Bit Error Rate Testing Configuration

Referring to FIG. 1, a basic bit error rate testing configuration is illustrated, in a simplified manner, including a pattern generator 100, a device under test (DUT) 102, an error detector 104, and an oscilloscope 140. The pattern generator 100 sends a repeating sequence of a base bit pattern 101 to the DUT 102 for testing. The base bit pattern 101 is often generated by a pseudo-random bit sequencer (PRBS) 108. Alternatively, the base bit sequence for testing the DUT 102 is stored in memory 110. The pattern generator 100 has a clock 112 to synchronize its operations including the PRBS generation and transmission 101 of the base bit patterns to the DUT 102. The pattern generator 100 may also include a pattern trigger signal generator 134 that may signal 135 at a fixed point in the base bit pattern as it is repeated, for example, at the beginning of the base bit pattern. The pattern trigger need not, and generally does not repeat every repetition of the pattern. But whenever it occurs, it is at the same position in the pattern.

Figure 2:
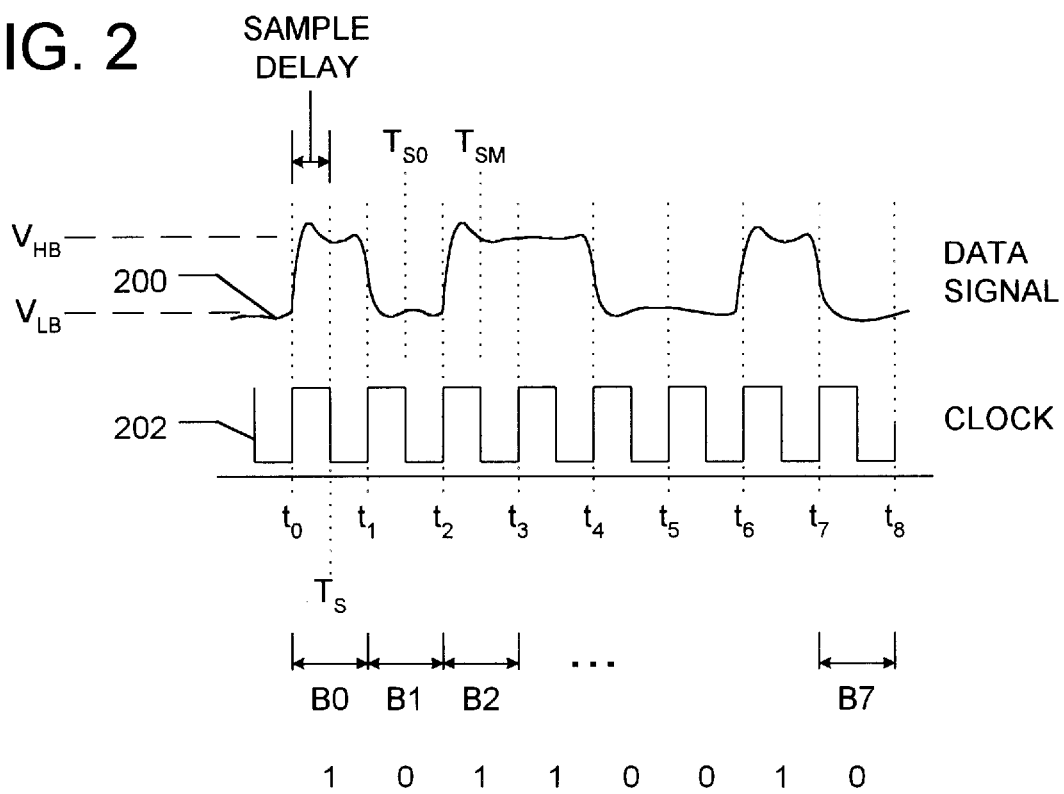
FIG. 2 illustrates a sample base bit pattern.

FIG. 2 illustrates a portion of one possible base bit sequence. The bit sequence signal 200 shows, as an example, an eight bit sequence of 10110010. A corresponding clock signal square wave 202 is also illustrated for eight clock periods—from time $t_0$ to time $t_8$. The clock signal 202 has a period of some predefined value. Accordingly, the bit sequence signal 200 has the same period as the clock signal 200 with each bit expressed within one period. The bit sequence signal 200 normally ranges from a low bit voltage, $V_{LB}$, also the first bit voltage, $V_{LB}$, signifying one of the two binary values (0 or 1) to the a high bit voltage, $V_{HB}$ also the second bit voltage, $V_{HB}$, signifying the other of the two binary values (1 or 0). Each bit of the bit sequence signal 200 may be at the first bit voltage, $V_{LB}$, representing perhaps 0 or at the second bit voltage, $V_{HB}$, representing perhaps 1. In the present example, the clock signal 202 represents the clock signal generated by the clock 112 of the pattern generator 100 or a clock 118 of the error detector 104. Alternatively, the bit sequence signal 200 represents a portion of the bit sequence 101 as generated by the pattern generator 100 or as transmitted by the DUT 102 and received by the error detector 104.

Continuing to refer to FIGS. 1 and 2, the bit sequence 101 is transmitted through the DUT 102 and received by the error detector 104. For convenience, the bit sequence transmitted from the DUT 102 and received by the error detector 104 will be represented by line 103 of FIG. 1 and referred to by the reference number 103. The error detector 104 includes its own PRBS 114 or memory 116 as a source of its own bit sequences. For convenience, the bit sequence from the PRBS 114 or the memory 116 is represented by line 115 of FIG. 1 and referred to by the reference number 115. Preferably, the bit sequence 115 of the error detector 104 is also a repeating bit sequences of the base bit pattern identical to the bit sequence 101 of the pattern generator 100 such that the bit sequence 103 from the DUT can be compared against the bit sequence 115 of the error detector 104 (identical to the bit sequence 101 of the pattern generator) to detect errors introduced by the DUT 102. For clarity, the bit sequence 103 received by the error detector 104 is referred to as a first bit sequence 103, and the bit sequence 115 generated by the error detector 104 is referred to as a second bit sequence 115.

The first bit sequence 103 received by the error detector 104 has a sequence of bits, each bit being at the low bit voltage, $V_{LB}$, or at the high bit voltage, $V_{HB}$. Each bit of the first bit sequence 103 is first compared with a slice voltage, $V_S$, 105 using a differential amplifier, for example differential amplifier 120, of FIG. 1. Commonly, the slice voltage 105 is set between the first bit voltage, $V_{LB}$, and the second bit voltage, $V_{HB}$, in order to allow the differential amplifier 120 to differentiate between a 0-bit (for example, a low bit voltage signal) and a 1-bit (for example, a high bit voltage signal). After the differential amplifier 120 translates the incoming bit sequence 103 to a differentiated bit 107, the differentiated bit 107 is compared with the corresponding bit of the second bit sequence 115. Techniques to synchronize the first bit sequence 103 to the second bit sequence 115 are known in the art. This comparison operation is provided by an exclusive-or element 122 where if the differentiated bit 107 is different from the corresponding bit of the second bit sequence 115, then the bit is in error.

As with the pattern generator 100, the error detector 104 has a clock 118 providing a clock signal to synchronize its operations. To avoid clutter, not all connections between the clock 118 and the illustrated portions of the error detector 104 are illustrated in FIG. 1. The clock 118 typically generates a clock signal similar to the clock signal 202 of FIG. 2.

Traditionally, the differentiated bit 107 is compared, or sampled, at a midpoint of the period of the bit to avoid sampling the bit during transition time. This is illustrated on FIG. 2. For example, the first bit of the bit sequence signal 200 having a period from $t_0$ to $t_1$ is sampled at a sample time $T_S$ where the $T_S$ is in between a first time $t_0$ and a second time $t_1$. The period of time between the beginning of the period, for example, $t_0$, to the time sample is taken, for example, $T_S$, is the sample delay, $T_S$. The sampling delay time, $T_S$, is controlled by a processor 126 using a delay circuit 111. Using the delay circuit 111, the processor 126 determines the sample time, $T_S$, when the sample of the translated bit is taken by controlling the sample delay relative to the beginning of the bit period. The sample time, $T_S$, is referred to by the reference numeral 109. A counter 124 counts the error bits.

The processor 126 sets the slice voltage 105, reads the counter 124, and displays the resulting BER value using a display 128. The processor 126 is connected to storage 130 for storage of various values during the operation of the processor 126.

The first bit sequence 103 is also received by the oscilloscope 140 sweeps per the trigger signal 135. The trigger signal is delayed by a trigger control 146 such that selectable portions of the base bit pattern is displayed on a multivalue display 142. If the pattern trigger 134 signals when the base bit pattern begins, then the trigger control 146 is used to delay the sweep of the data, the first bit sequence 103, such that $n^{th}$ bit is displayed 144. For example, the trigger control 146 delays the sweeping of the data 103 for two clock periods to sweep the data 103 on the third bit, thereby displaying 144 the waveform of the third bit of the base bit pattern. Using the multivalue display 142, the oscilloscope 140 displays a waveform diagram 144 made of multiple instances of the same $n^{th}$ waveform of the base bit sequence. The displayed waveform 144 is a multivalued display showing an overlay of the same $n^{th}$ waveform of the base bit sequence, the high voltage signal levels of the waveform 144 are referred to as (for convenience) the high multivalue voltage, $V_{HM}$, and the low voltage signal levels of the waveform diagram 144 are referred to as (for convenience) the low multivalue voltage, $V_{LM}$.

The bit sequence signal 200 of FIG. 2 represents a sample base bit pattern having eight bits 10110010, each bit identified as B0, B1, B2, . . . to B7. In computing technology, it is customary to count beginning at number zero; thus, the first bit is bit B0 and the eighth bit is bit B7. In practice, the base bit pattern is typically $2^7-1$ bits or longer; however, the bit pattern 200 of FIG. 2 is used herein as a sample base bit pattern for the purposes of illustrating the present invention. A period of time from an initial sample time, $T_{S0}$, to a final sample time, $T_{SM}$, represents the transition between the second bit (B1, a 0-bit) and the third bit (B2, a 1-bit), including portions of B1 and B2, of the base bit pattern 200 of FIG. 2. Here, the initial sample time, $T_{S0}$, is referred to as the beginning time, or the first time, of the waveform period to be displayed and $T_{SM}$ is referred to as the ending time of the waveform period.

Figure 3:
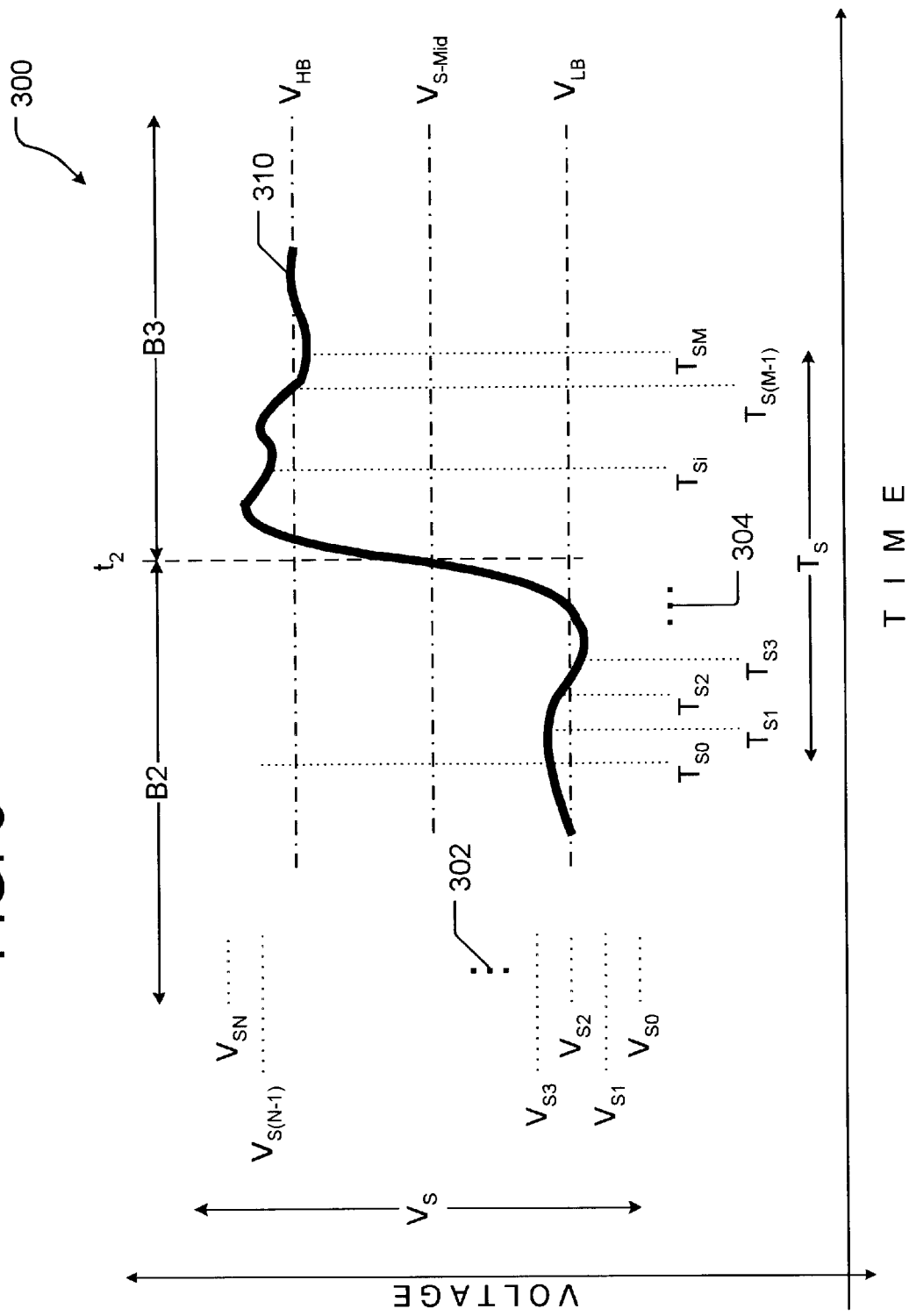
FIG. 3 illustrates a waveform diagram.

FIG. 3 illustrates a sample waveform diagram 300. A waveform curve 310 represents the transition portion from the beginning time, $T_{S0}$, to the ending time, $T_{SM}$, of the sample base bit pattern 200 of FIG. 2. Referring to FIG. 3, the waveform diagram 300 of FIG. 3 shows an overlay of many instances of the transition portion as the base bit pattern is repeatedly transmitted by the DUT 102 and received by the error detector 104.

Parts of the waveform curve 310 is at or near a first voltage value, $V_{LB}$, (representing perhaps a 0-bit value), at or near a second voltage value, $V_{HB}$ (representing perhaps a 1-bit value), or anywhere in between. The differential amplifier 120 differentiates the bit value. Referring to FIGS. 1 and 3, to merely distinguish the bit value as either a 0-bit or a 1-bit, the slice voltage, $V_S$, 105, is set to a value at or near the midpoint between the first bit voltage, $V_{LB}$, and the second bit voltage, $V_{HB}$, as illustrated in FIG. 3 as $V_{S-Mid}$. However, note that the slice voltage, $V_S$, 105 may be set at any voltage including values less than the first bit voltage, $V_{LB}$, or greater than the second bit voltage, $V_{HB}$. Likewise, to merely distinguish the bit value as either a 0-bit or a 1-bit, the sample delay, $T_S$, 109 is set at the midpoint between a clock period as illustrated in FIG. 2. However, note that the sample delay, $T_S$, 109 may be set at any value.

In order to display the waveform 310 on display 128, the multivalue voltages of the base bit pattern are determined for the period of time to be displayed. For example, to display the waveform 310 for a period of time from the beginning time, $T_{S0}$, to the ending time, $T_{SM}$, the voltage values for that time period are determined. This is accomplished by determining the multivalue voltage, $V_M$, at the first sampling time $T_{S0}$, and repeating the determination process at each incremental time until the ending time $T_{SM}$ is reached.

Determining Multivalue Voltage, $V_M$

Figure 4A:
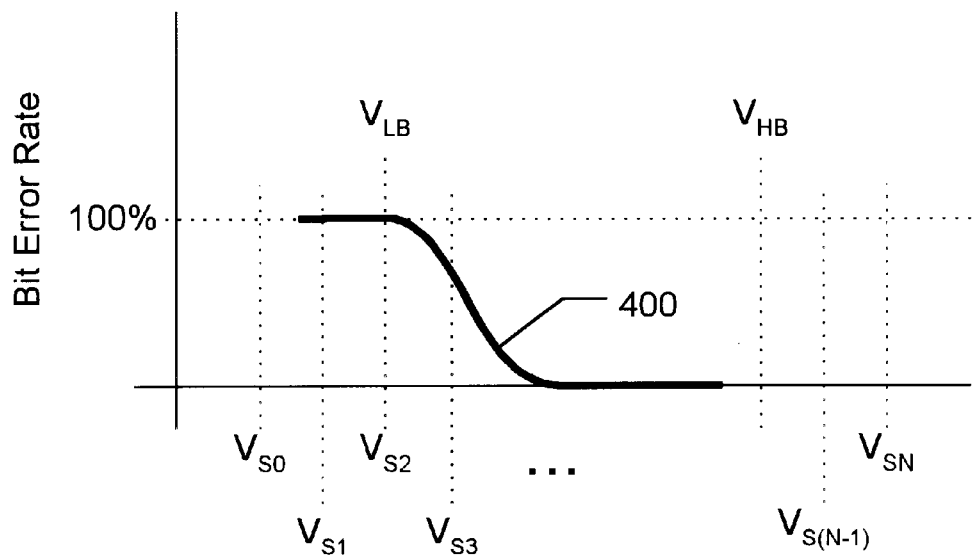
FIG. 4A illustrates a bit error rate (BER) curve constructed in accordance with an embodiment of the present invention.

To determine the multivalue voltage, $V_M$, at a particular sampling delay time $T_{S0}$, first, a BER curve is constructed at the $T_{S0}$. FIG. 4A illustrates a sample BER curve 400. Referring to FIGS. 1, 3, and 4A, to construct the BER curve 400, the slice voltage, $V_S$, 105 is set at an initial slice voltage $V_{S0}$ and increased incrementally to a final slice voltage $V_{SN}$ where the initial slice voltage, $V_{S0}$, is less than the first bit voltage, $V_{LB}$, and the final slice voltage, $V_{SN}$, is greater than the second bit voltage, $V_{HB}$. The number, N, of increments of the slice voltage, $V_S$, between the initial slice voltage, $V_{S0}$, and the final slice voltage, $V_{SN}$, is arbitrary. Incremental slice voltages are indicated in FIG. 3 by slice voltage levels $V_{S0}$, $V_{S1}$, $V_{S2}$, ellipsis 302, $V_{S(N-1)}$, and $V_{SN}$.

At each increment of the slice voltage, $V_S$, including at the first increment, $V_{S0}$, BER is taken for a predetermined number of repeats of that particular bit. In the present 8-bit base bit pattern example, at delay $T_{S0}$, the particular bit under consideration is the second bit, B1, of the 8-bit base bit pattern having value of a 0-bit at the first bit voltage level, $V_{LB}$. Therefore, the BER is taken for a predetermined number of repeats of the bit B1. At the initial slice voltage $V_{S0}$, most or all bit signal values, including the B1 signal values will translate (by the differential amplifier 120) to a 1-bit because all incoming bits have signal values higher than the initial slice voltage $V_{S0}$. Thus, the BER of the second bit at $T_{S0}$ using the initial slice voltage of $V_{S0}$ is at 100%. That is, all instances of bit B1 will be translated, in error, as a 1-bit. As the slice voltage, $V_S$, incrementally increases and passes the actual voltage value of bit B1 (which, in the present example, is slightly above the first bit voltage, $V_{LB}$), the BER decreases and eventually becomes zero percent. As the slice voltage, $V_S$, approaches and passes the actual voltage value of bit B1, an increasing percentage of B1 (a 0-bit) bits are correctly counted as 0-bits. Thus, the number of bit errors decreases to zero as the slice voltage, $V_S$, passes the actual voltage value of bit B1. As the slice voltage, $V_S$, moves well beyond the actual voltage value of bit B1, the BER remains at zero because the differential amplifier 120 correctly translates bit B1 as a 0-bit. This behavior of the BER curve for bit B1 is illustrated as BER curve 400 of FIG. 4A. At the initial slice voltage, $V_{S0}$, the BER for bit B1 is at 100%. As the slice voltage, $V_S$, moves to and passes the actual voltage value of bit B1 (slightly over the first bit voltage, $V_{LB}$, in the present example), the BER decreases and drops to zero.

Figure 4B:
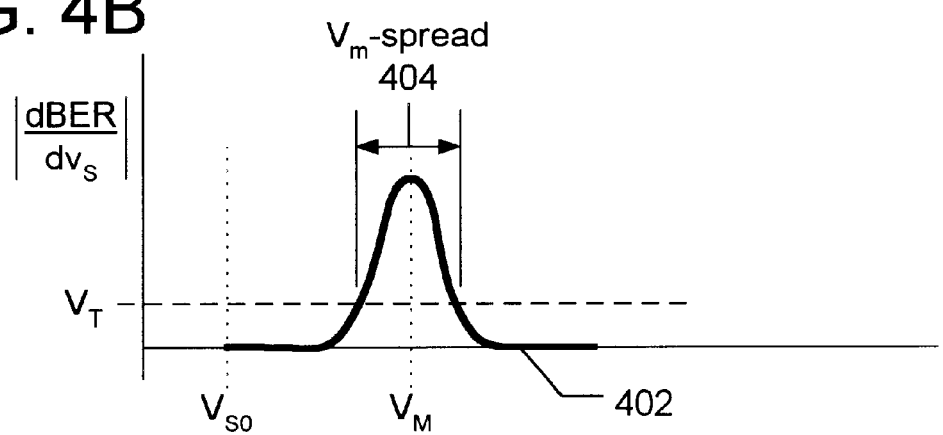
FIG. 4B illustrates a BER-derivative curve representing derivative of the BER curve of FIG. 4A.

Following the construction of the BER curve 400, a derivative of the BER curve is taken with respect to the slice voltage. The derivative of the BER with respect to the slice voltage is expressed as $dBER/dv_S$. For convenience of working with the values, absolute value of the derivative of the BER curve may be used. FIG. 4B illustrates the absolute value BER-derivative curve 402 (herein after the "BER-derivative curve"). Referring to FIGS. 4A and 4B, The BER-derivative curve 402 has zero value around the initial slice voltage, $V_{S0}$, and well beyond the actual voltage value of bit B1 because the BER curve 400 is flat around these regions. At the actual voltage value of bit B1, the BER-derivative curve has the greatest value. Ideally, this is the same voltage as the first bit voltage, $V_{LB}$; however, in practice, this is rarely the case. The slice voltage at which the BER-derivative curve has the greatest value may be considered the multivalue voltage, $V_M$. Alternatively, the multivalue voltage, $V_M$, is determined as the slice voltage where the BER is 50%. This value is equivalent to that determined using the oscilloscope measurement using trace averaging to minimize noise on the trace.

Figure 5:
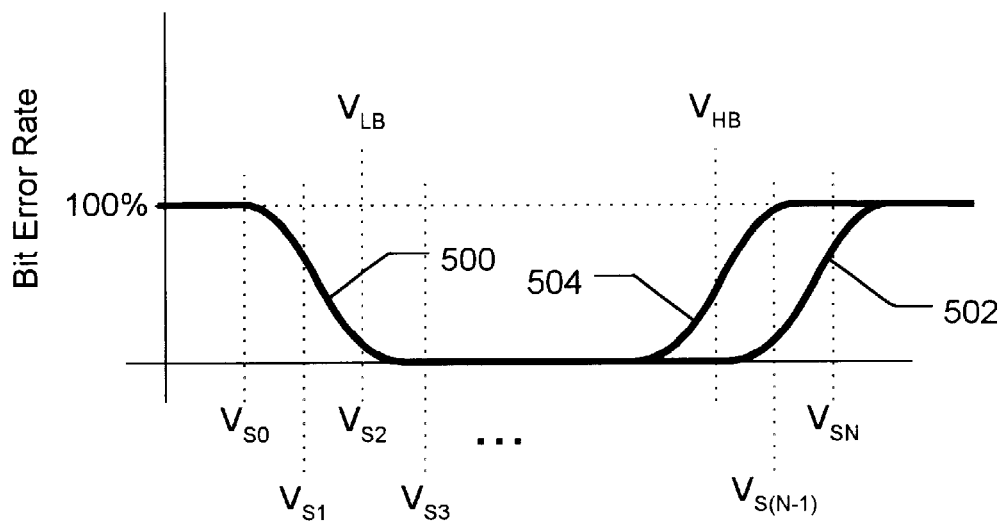
FIG. 5 illustrates additional BER curves constructed in accordance with another embodiment of the present invention.

The multivalue voltage, $V_M$, for the time period between the beginning time, $T_{S0}$, and the ending time, $T_{SM}$, is determined by repeating the above procedure for each incremental time delay spanning the time period. For example, the above technique can be repeated at incremental delay times $T_{S1}$, $T_{S2}$, etc. to the ending time $T_{SM}$ where M is the number of increments in the time period. Incremental delay times for sampling are indicated in FIG. 3 by delays $T_{S0}$, $T_{S1}$, $T_{S2}$, ellipsis 304, $T_{S(M-1)}$, and $T_{SM}$. FIG. 5 illustrates three additional BER curves. BER curve 500 may represent the BER curve at time $T_{S3}$ of FIG. 3. BER curve 502 may represent the BER curve at time $T_{S1}$ of FIG. 3. BER curve 504 may represent the BER curve at the ending time, $T_{SM}$, of FIG. 3.

In one embodiment of the invention, once the multivalue voltage, $V_M$, for each of the delay times is determined for the entire time period, these values are displayed as an eyeline waveform diagram on the display 128 of the error detector 104 of FIG. 1.

Determining the Multivalue Voltage Spread, $V_M$ Spread

FIG. 4B illustrates the BER-derivative curve 402 which is the absolute value of the derivative of the BER curve 400 of FIG. 4A. Note that the BER-derivative curve 402 has Gaussian shape generally around the multivalue voltage, $V_M$. This is because the BER curve 400 of FIG. 4A is not a square curve and has transition values ranges around the actual voltage value of bit B1. This, in turn, is because the low bit signals of the repeated instances of bit B1 may vary. Accordingly, a threshold value, $V_T$ determines a multivalue voltage spread, $V_M$-spread 404, of the multivalue voltage. The $V_M$-spread 404 is a range of slice voltages for which the value of the BER-derivative curve is above the $V_T$. In another embodiment of the invention, the $V_M$-spread 404 is determined at each sample delay increment for the entire time period. Then, these values are displayed as the eyeline waveform diagram on the display 128 of the error detector 104 of FIG. 1.

Apparatus

Referring again to FIG. 1, an apparatus 104 according to the present invention has the processor 126 and storage 130. The storage 130 includes instructions for the processor to utilize the all other portions of the error detector 104 to perform the operations described herein above to display the resulting eyeline waveform diagram. In summary, the instructions include instructions for the processor 126 to receive a first bit sequence comprising repeated base bit pattern, each bit either a 0-bit signified by a first bit voltage, $V_{LB}$, and 1-bit signified by a second bit voltage, $V_{HB}$. Further, the storage 130 includes instructions for the processor to determine, at a first time within the base bit pattern and each incremental time thereafter for a predetermined period of time, multivalue voltage, $V_M$, or multivalue voltage spread, $V_M$-spread. Then, to display the multivalue voltage or multivalue voltage spread at the first time and the multivalue voltage spread at each incremental time thereafter. The storage 130 further comprises instructions for the processor to determine the multivalue voltage spread at the first time by constructing a bit error rate (BER) curve, the BER curve spanning a range of voltages from a low slice voltage to a high slice voltage wherein the low slice voltage is less than the first bit voltage and wherein the high slice voltage is greater than the second bit voltage.

From the foregoing it will be appreciated that the above described technique and apparatus for displaying an eyeline waveform on an error performance analyzer reduces hardware requirements because an oscilloscope is not needed. Although specific embodiments of the present invention have been described and illustrated, the invention is not to be limited to the specific forms or arrangements of parts so described and illustrated. For example, non-PBRS bit sequence may be used to test the DUT or to display the waveform. The invention is limited only by the claims.

What is claimed is:

1. A method of displaying a waveform on an error performance analyzer comprising:
   a. receiving a first bit sequence having repeated base bit pattern, the repeated base bit pattern having a first bit voltage, $V_{LB}$, and a second bit voltage, $V_{HB}$;
   b. determining, at a first time within the repeated base bit pattern and each incremental time thereafter for a predetermined period of time, a multivalue voltage, $V_M$; and
   c. displaying the multivalue voltage at the first time and the multivalue voltage at each incremental time thereafter.

2. The method recited in claim 1 wherein the multivalue voltage at the first time is determined by constructing a bit error rate (BER) curve, the BER curve spanning a range of voltages from a low slice voltage to a high slice voltage wherein the low slice voltage is less than the first bit voltage and wherein the high slice voltage is greater than the second bit voltage.

3. The method recited in claim 2 wherein the multivalue voltage is the slice voltage where absolute value of derivative of the BER curve is greatest.

4. The method recited in claim 2 wherein the multivalue voltage is the slice voltage where the BER is at 50%.

5. The method recited in claim 2 wherein absolute value of derivative of the BER curve for each time increment is taken to determine the multivalue voltage of each of the time increment.

6. A method of displaying a waveform on an error performance analyzer comprising:
   a. receiving a first bit sequence having repeated base bit pattern, the repeated base bit pattern having a first bit voltage, VLB, and a second bit voltage, VHB;
   b. determining, at a first time within the repeated base bit pattern and each incremental time thereafter for a predetermined period of time, multivalue voltage spread, VM-spread and
   c. displaying the multivalue voltage spread at the first time and the multivalue voltage spread at each incremental time thereafter.

7. The method recited in claim 6 wherein the multivalue voltage spread at the first time is determined by constructing a bit error rate (BER) curve, the BER curve spanning a range of voltages from a low slice voltage to a high slice voltage wherein the low slice voltage is less than the first bit voltage and wherein the high slice voltage is greater than the second bit voltage.

8. The method recited in claim 7 wherein the multivalue voltage spread is a range of the slice voltages where the value of the BER-derivative curve is above a predetermined threshold value.

9. The method recited in claim 6 wherein absolute value of derivative of the BER curve for each time increment is taken to determine the multivalue voltage spread of each of the time increment.

10. An apparatus for displaying a waveform diagram, the apparatus comprising:
    a processor;
    storage connected to the processor, the storage including instructions for the processor to
    a. receive a first bit sequence having repeated base bit pattern, the repeated base bit pattern having a first bit voltage, VLB, and a second bit voltage, VHB;
    b. determine, at a first time within the repeated base bit pattern and each incremental time thereafter for a predetermined period of time, multivalue voltage spread, VM-spread; and
    c. display the multivalue voltage spread at the first time and the multivalue voltage spread at each incremental time thereafter.

11. The apparatus recited in claim 10 wherein the storage further comprises instructions for the processor to determine the multivalue voltage spread at the first time by constructing a bit error rate (BER) curve, the BER curve spanning a range of voltages from a low slice voltage to a high slice voltage wherein the low slice voltage is less than the first bit voltage and wherein the high slice voltage is greater than the second bit voltage.

12. The apparatus recited in claim 10 wherein the multivalue voltage spread is a range of the slice voltage where the value of the BER-derivative curve is above a predetermined threshold value.

13. The apparatus recited in claim 10 wherein absolute value of derivative of the BER curve for each time increment is taken to determine the multivalue voltage spread of each of the time increment.

* * * * *